（12) United States Patent
Baselmans et al.

(10) Patent No.: US 8,610,878 B2
(45) Date of Patent: Dec. 17, 2013

(54) LITHOGRAPHIC APPARATUS AND METHOD

(75) Inventors: Johannes Jacobus Matheus Baselmans, Oirschot (NL); Francis Fahrni, Eindhoven (NL); Gerardus Johannes Joseph Keijsers, Venlo (NL); Heine Melle Mulder, Veldhoven (NL); Willem Richard Pongers, Veldhoven (NL); Joost Cyrillus Lambert Hageman, Eindhoven (NL); Mattheus Johannes Van Bruggen, Rijswijk (NL); Johannes Franciscus Roosekrans, Houthalen (BE); David James Butler, Veldhoven (NL); Patrick Marcel Maria Thomassen, Eindhoven (NL); Gabriela Vesselinova Paeva, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 329 days.

(21) Appl. No.: 12/966,448

(22) Filed: Dec. 13, 2010

(65) Prior Publication Data

US 2011/0216297 A1 Sep. 8, 2011

Related U.S. Application Data

(60) Provisional application No. 61/310,532, filed on Mar. 4, 2010, provisional application No. 61/331,884, filed on May 6, 2010.

(51) Int. Cl.
*G03B 27/32* (2006.01)
*G03B 27/42* (2006.01)
*G03B 27/54* (2006.01)
*G03B 27/58* (2006.01)

(52) U.S. Cl.
USPC .................. 355/72; 355/53; 355/67; 355/77

(58) Field of Classification Search
CPC ............ G03F 7/70058; G03F 7/70066; G03F 7/70425; G03F 7/70725
USPC .............................. 355/53, 67, 71, 72, 75, 77
See application file for complete search history.

(56) References Cited

U.S. PATENT DOCUMENTS

| 5,638,211 A | 6/1997 | Shiraishi |
| 6,342,942 B1 * | 1/2002 | Uzawa ............................. 355/53 |

(Continued)

FOREIGN PATENT DOCUMENTS

| JP | 05-102003 A | 4/1993 |
| JP | 09-115811 A | 5/1997 |

(Continued)

OTHER PUBLICATIONS

English-Language Abstract for Japanese Patent Publication No. 09-115811 A, published May 2, 1997; 1 page.

(Continued)

*Primary Examiner* — Toan Ton
*Assistant Examiner* — Colin Kreutzer
(74) *Attorney, Agent, or Firm* — Sterne, Kessler, Goldstein & Fox P.L.L.C.

(57) ABSTRACT

A lithographic apparatus includes an illumination system configured to provide a first beam of radiation, which forms a first mask illumination region, and configured to substantially simultaneously provide a second beam of radiation, which forms a second mask illumination region. The first and second illumination regions being configured to substantially simultaneously illuminate a same mask. The lithographic apparatus also includes a projection system configured to project the first radiation beam such that it forms a first substrate illumination region and configured to simultaneously project the second radiation beam such that it forms a second substrate illumination region.

20 Claims, 10 Drawing Sheets

(56) References Cited

U.S. PATENT DOCUMENTS

Figure 1:
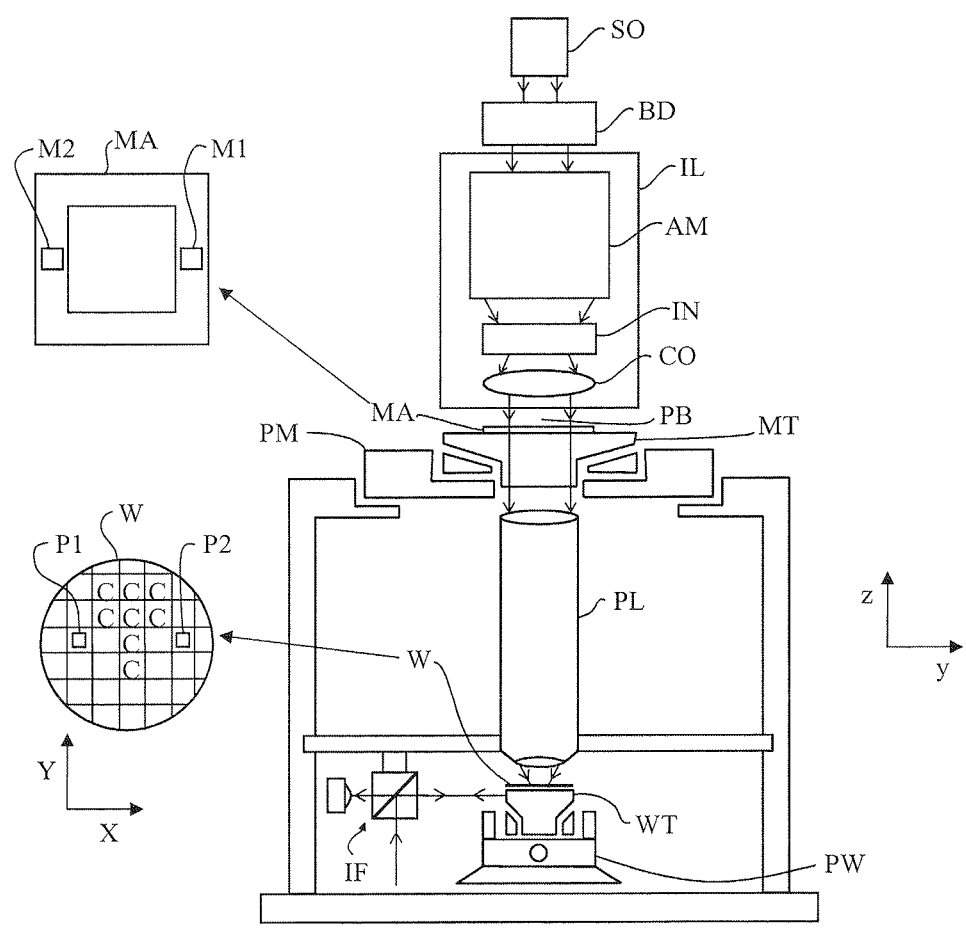

| | | | |
|---|---|---|---|
| 7,215,471 B2 | 5/2007 | Hwang | |
| 7,884,921 B2 | 2/2011 | Noboru et al. | |
| 7,916,270 B2 | 3/2011 | Nagasaka | |
| 2001/0000974 A1* | 5/2001 | Hazelton et al. | 355/53 |
| 2003/0137644 A1* | 7/2003 | Tanaka et al. | 355/67 |
| 2006/0082747 A1* | 4/2006 | Fukuhara et al. | 355/53 |
| 2007/0242255 A1* | 10/2007 | Nagasaka | 355/69 |
| 2007/0279606 A1* | 12/2007 | Nagasaka | 355/40 |
| 2008/0068570 A1* | 3/2008 | Streefkerk et al. | 355/53 |
| 2010/0053583 A1* | 3/2010 | Smith et al. | 355/67 |
| 2010/0079743 A1 | 4/2010 | Hidaka et al. | |
| 2011/0141443 A1* | 6/2011 | McKinsey | 355/53 |

FOREIGN PATENT DOCUMENTS

| | | |
|---|---|---|
| JP | 11-168043 A | 6/1999 |
| JP | 11-212266 A | 8/1999 |
| JP | 2000-021748 A | 1/2000 |
| JP | 2005-043869 A | 2/2005 |
| JP | 2007-287760 A | 11/2007 |
| JP | 2010-087513 A | 4/2010 |
| WO | WO 2007/100087 | 9/2007 |
| WO | WO 2010/035901 A1 | 4/2010 |

OTHER PUBLICATIONS

English-Language Abstract for Japanese Patent Publication No. 11-168043 A, published Jun. 22, 1999; 1 page.

English-Language Abstract for Japanese Patent Publication No. 11-212266 A, published Aug. 6, 1999; 1 page.

English-Language Abstract for Japanese Patent Publication No. 2000-021748 A, published Jan. 21, 2000; 1 page.

* cited by examiner

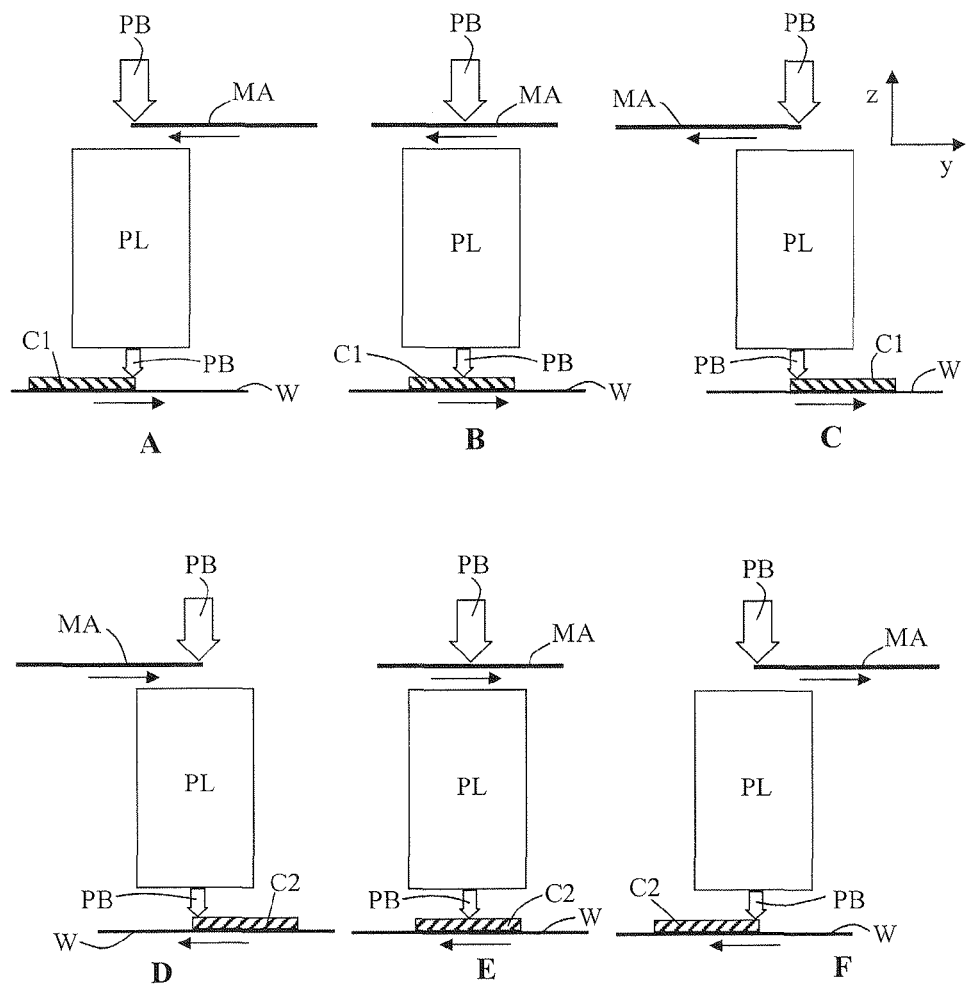
Figure 2 – Prior Art

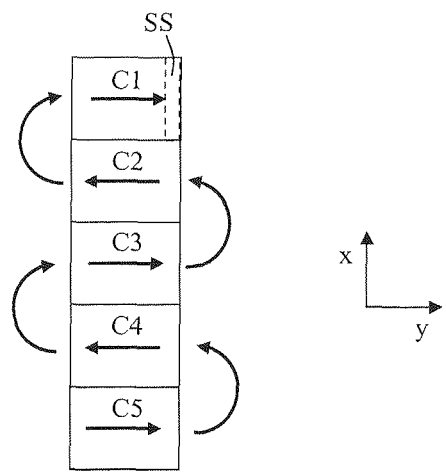
Figure 3 – Prior Art
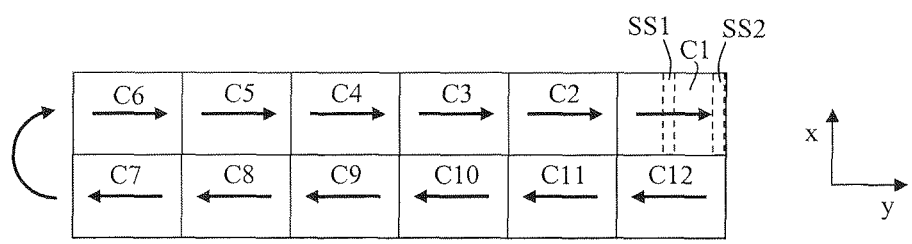
Figure 5

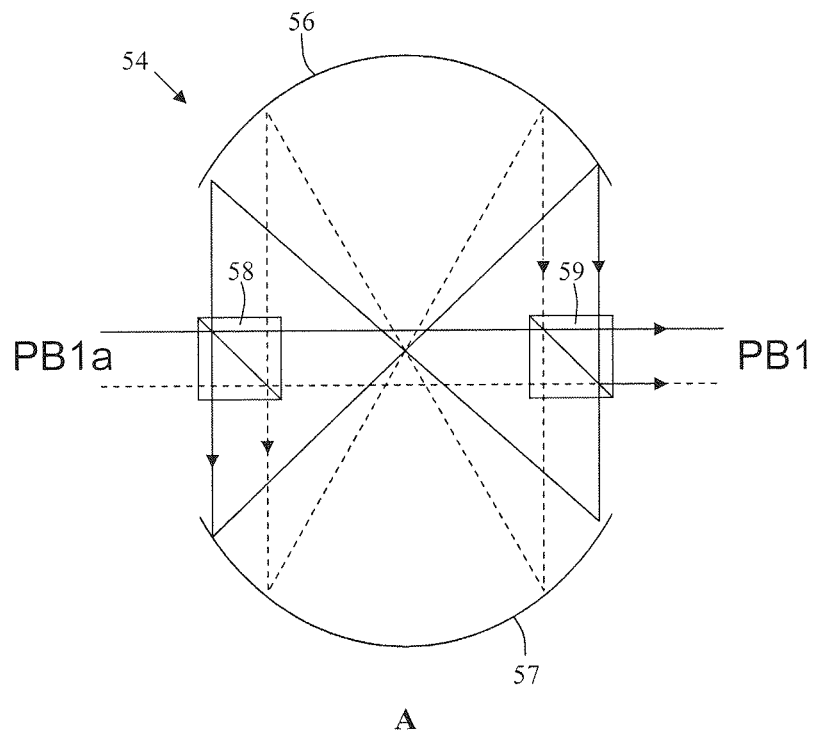
A
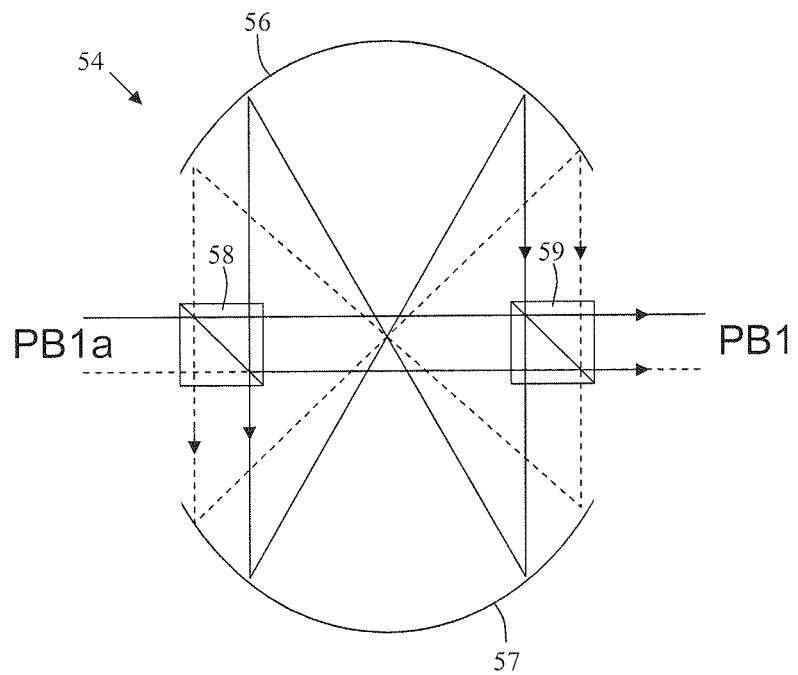
B
Figure 13

LITHOGRAPHIC APPARATUS AND METHOD

CROSS REFERENCE TO RELATED APPLICATIONS

This application claims the benefit under 35 U.S.C. 119(e) to U.S. Provisional Patent Application Nos. 61/310,532, filed Mar. 4, 2010, and 61/331,884, filed May 6, 2010, which are both incorporated by reference herein in their entireties.

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed.

Known lithographic apparatus include so-called scanners, in which each target portion is irradiated by scanning the mask through a radiation beam in a given direction (the "scanning"-direction) while synchronously scanning the substrate parallel or anti parallel to this direction. After each scan the direction of scanning movement of the mask and the direction of scanning movement of the substrate is reversed. The substrate is also moved transverse to the scanning direction. These movements are time consuming and thus have a detrimental impact on the throughput of the lithographic apparatus (i.e., the number of substrates exposed per hour by the lithographic apparatus).

SUMMARY

It is desirable to provide, for example a lithographic apparatus and device manufacturing method which obviates or mitigates one or more of the problems of the prior art, whether identified herein or elsewhere.

According to a first aspect of the present invention, there is provided a lithographic apparatus comprising an illumination system configured to provide a first beam of radiation that forms a first mask illumination region and configured to substantially simultaneously provide a second beam of radiation that forms a second mask illumination region. The first and second illumination regions being configured to substantially simultaneously illuminate the same mask. The lithographic apparatus further comprises a projection system configured to project the first radiation beam such that it forms a first substrate illumination region and configured to substantially simultaneously project the second radiation beam, such that it forms a second substrate illumination region.

According to a second aspect of the present invention, there is provided a lithographic apparatus comprising a projection system configured to receive a patterned beam of radiation and to separate the patterned beam of radiation into a first patterned beam of radiation and a second patterned beam of radiation. The projection system is further configured to project the first patterned beam of radiation, such that it forms a first substrate illumination region, and to substantially simultaneously project the second patterned beam of radiation, such that it forms a second substrate illumination region.

According to a third aspect of the present invention, there is provided a lithographic method comprising the following steps. Providing two beams of radiation using an illumination system. Using the two radiation beams to illuminate two mask illumination regions. Moving a mask through the two mask illumination regions, such that the mask is illuminated by the two mask illumination regions and thereby patterns the two radiation beams. Projecting the two radiation beams such that they illuminate two substrate illumination regions. Moving a substrate through the two substrate illumination regions such that the substrate is illuminated by the two substrate illumination regions and thereby receives the pattern carried by the two radiation beams.

According to a fourth aspect of the present invention, there is provided a lithographic method comprising the following steps. Providing a beam of radiation using an illumination system. Using the radiation beam to illuminate a mask illumination region. Moving a mask through the mask illumination region, such that the mask is illuminated by the mask illumination region and thereby patterns the radiation beam. Using a projection system to separate the patterned radiation beam into a first patterned radiation beam and a second patterned radiation beam. Projecting the two patterned radiation beams, such that they illuminate two substrate illumination regions. Moving a substrate through the two substrate illumination regions such that the substrate is illuminated by the two substrate illumination regions and thereby receives the pattern carried by the two radiation beams.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 1 schematically depicts a lithographic apparatus according to an embodiment of the present invention.

FIG. 2 schematically depicts two successive scanning exposures performed by a lithographic apparatus according to the prior art.

FIG. 3 schematically depicts five successive scanning exposures performed by a lithographic apparatus according to the prior art.

FIGS. 4A-4F schematically depict a scanning exposure performed by a lithographic apparatus according to an embodiment of the present invention.

FIG. 5 schematically depicts twelve successive scanning exposures performed by a lithographic apparatus according to an embodiment of the present invention.

FIGS. 6A-6F schematically depict the operation of reticle masking blades of an embodiment of the present invention.

Figure 7:
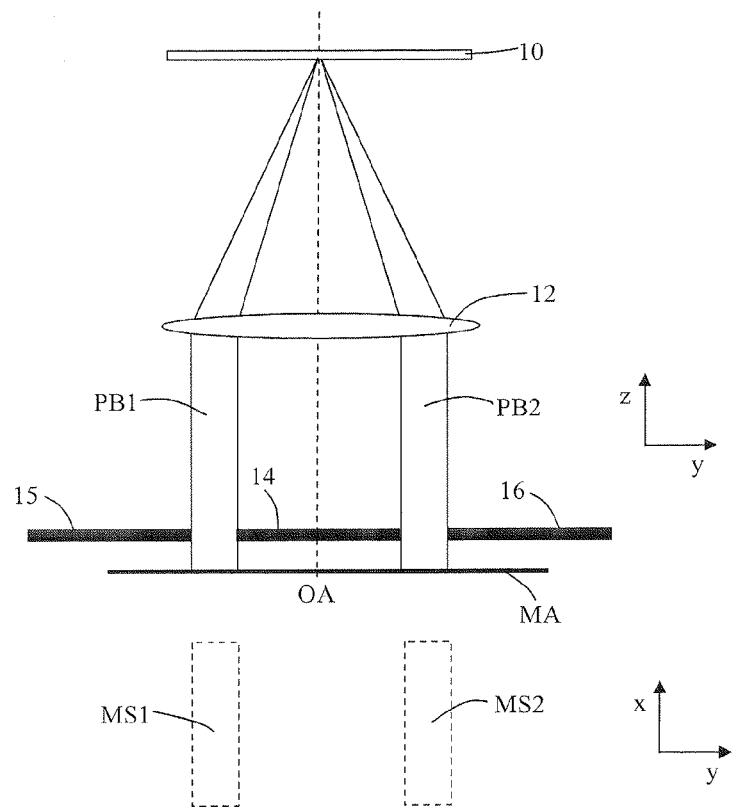

FIG. 7 schematically depicts part of an illumination system according to an embodiment of the present invention.

Figure 8:
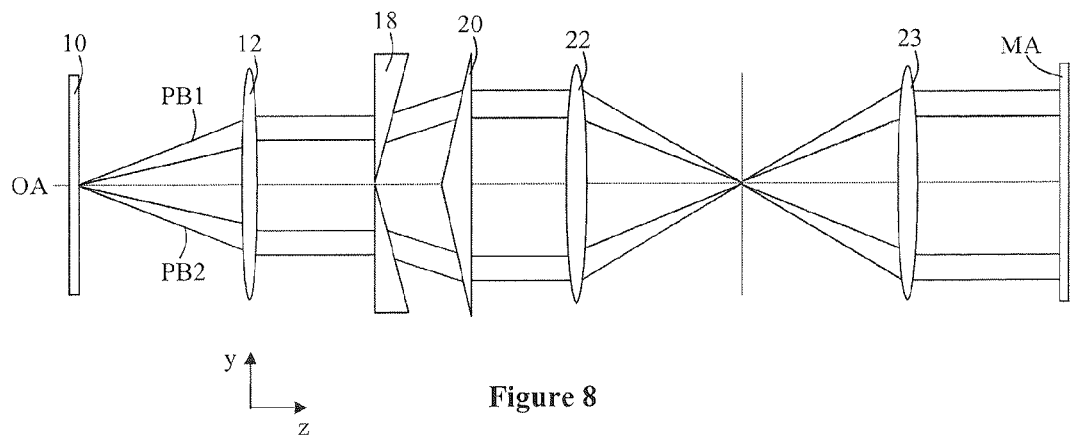

FIG. 8 is an alternative depiction of the embodiment shown in FIG. 7.

Figure 9:
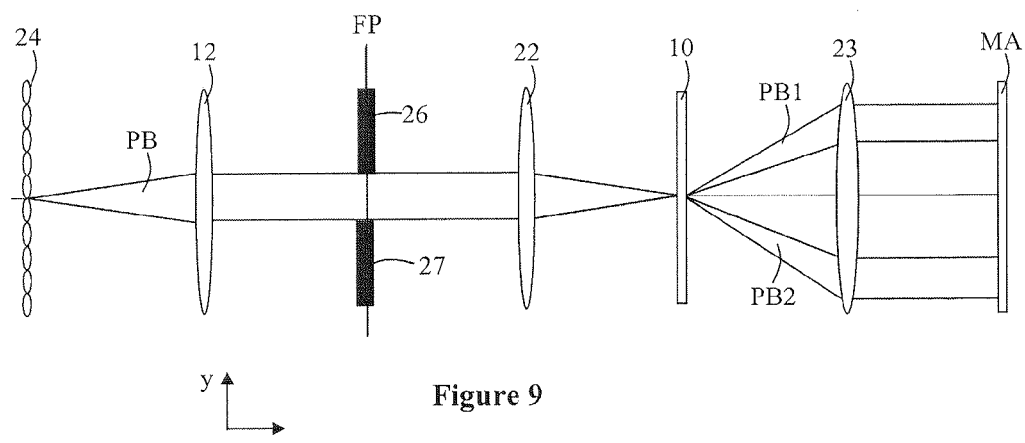

FIG. 9 schematically depicts part of an illumination system according to an alternative embodiment of the present invention.

Figure 10:
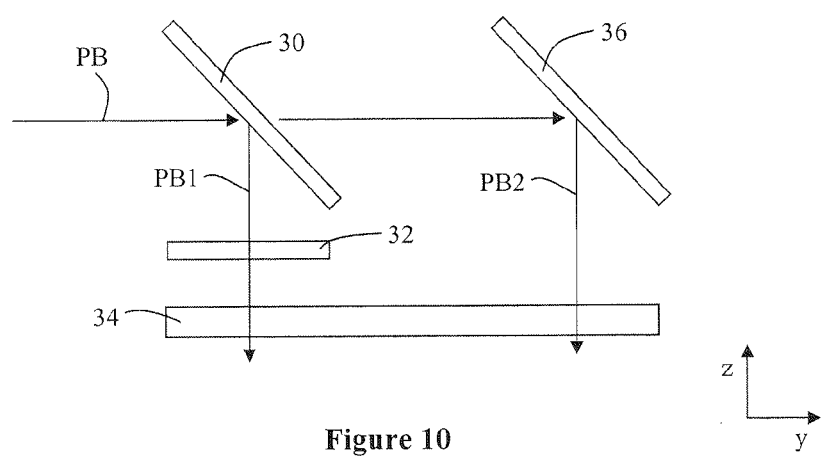

FIG. 10 schematically depicts part of an illumination system of the present invention.

Figure 11:
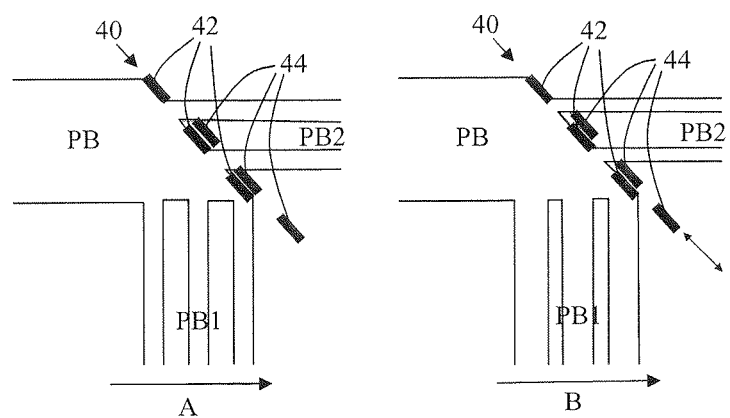

FIG. 11 schematically depicts part of the illumination system of FIG. 10 in more detail.

Figure 12:
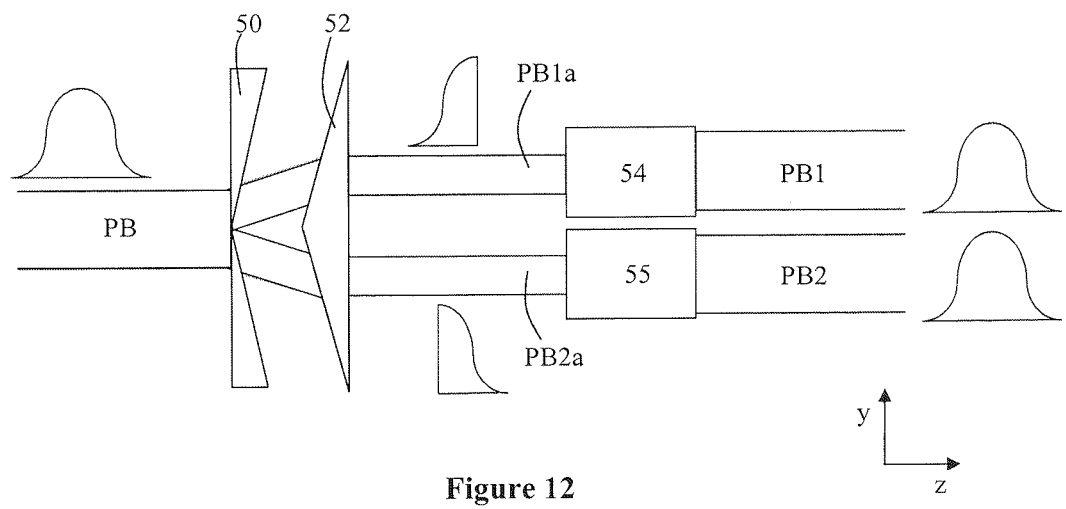

FIG. 12 schematically depicts part of an illumination system according to a further alternative embodiment of the present invention.

FIGS. 13A-13B schematically depict part of the illumination system shown in FIG. 12.

Figure 14:
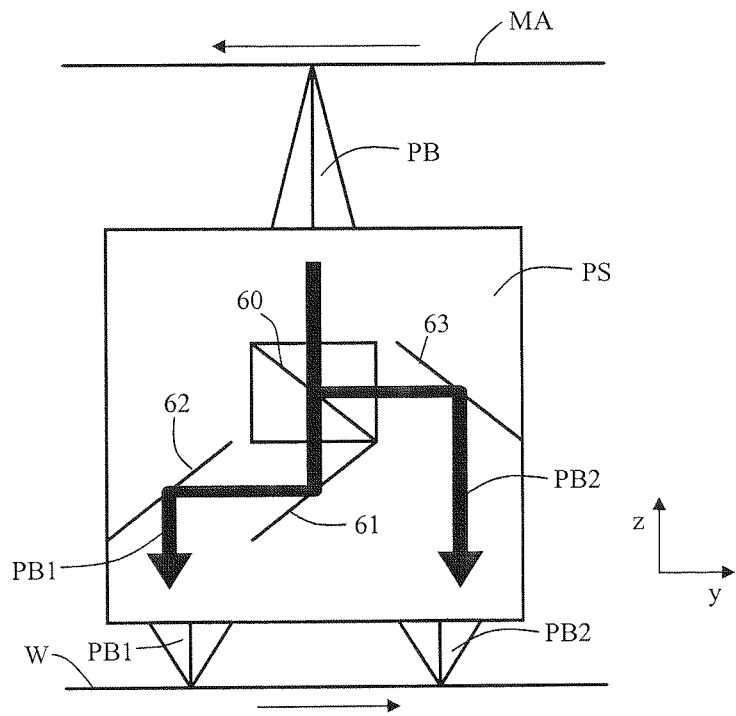

FIG. 14 schematically depicts a projection system according to an alternative embodiment of the present invention.

Figure 15:
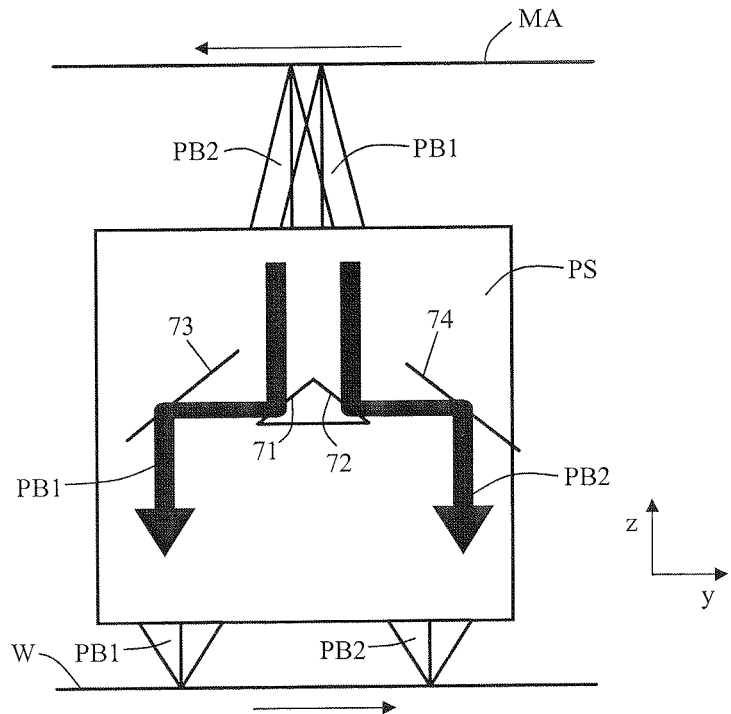

FIG. 15 schematically depicts a projection system according to a further alternative embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "mask" is used herein to refer to a device that can be used to impart a radiation beam with a pattern in its cross-section to create a pattern in a target portion of the substrate. Masks are well known in lithography, and include mask types such as binary, alternating phase-shift, and attenuated phase-shift, as well as various hybrid mask types. Masks may be transmissive or reflective. The term "reticle" may be used instead of the term "mask". Where the context allows, any use of the terms "mask" or "reticle" herein may be considered synonymous with a more general term "patterning device". It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

The support structure holds the mask. It holds the mask in a way depending on the orientation of the mask, the design of the lithographic apparatus, and other conditions, such as for example whether or not the mask is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the mask is at a desired position, for example with respect to the projection system.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion techniques are well known in the art for increasing the numerical aperture of projection systems.

FIG. 1 schematically depicts a lithographic apparatus according to an embodiment of the present invention. The apparatus comprises an illumination system (illuminator) IL to condition a beam PB of radiation (e.g., DUV radiation or EUV radiation), a support structure (e.g., a support structure) MT to support a patterning device (e.g., a mask) MA and connected to first positioning device PM to accurately position the patterning device with respect to item PL, a substrate table (e.g., a wafer table) WT for holding a substrate (e.g., a resist coated wafer) W and connected to second positioning device PW for accurately positioning the substrate with respect to item PL, and a projection system (e.g., a refractive projection lens) PL configured to image a pattern imparted to the radiation beam PB by patterning device MA onto a target portion C (e.g., comprising one or more dies) of the substrate W.

As here depicted, the apparatus is of a transmissive type (e.g., employing a transmissive mask). Alternatively, the apparatus may be of a reflective type (e.g., employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g., mask) MA, which is held on the support structure MT. Having traversed the patterning device MA, the beam PB passes through the lens PL, which focuses the beam onto a target portion C of the substrate W. With the aid of the second positioning device PW and position sensor IF (e.g., an interferometric device), the substrate table WT can be moved accurately, e.g., so as to position different target portions C in the path of the beam PB. Similarly, the first positioning device PM and another position sensor (which is not explicitly depicted in FIG. 1) can be used to accurately position the patterning device MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus may for example be used in scan mode. In scan mode, the support structure MT and the substrate table WT are scanned synchronously while a pattern imparted to the beam PB is projected onto a target portion C (i.e., a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

FIG. 2 shows schematically exposure of successive target portions of a substrate. For ease of description the target portions are referred to as dies although the target portions may comprise more than one die. Referring to FIG. 2A, a beam of radiation PB is used to illuminate a mask illumination region (which may be referred to as a mask exposure slit) as indicated by a downwardly pointing arrow. A mask MA is moved through the illuminated mask exposure slit in a scanning motion from left to right (as indicated by an arrow). When the mask MA is in the position shown in FIG. 2A the radiation beam PB illuminates a left hand end of the radiation mask MA. The radiation beam is patterned by the mask MA and passes through a projection system PL. The projection system PL projects the patterned radiation onto a first die C1 on a substrate W. The projection system PL has a reduction factor of 4, and the effect of the reduction factor is indicated schematically by representing the radiation beam PB using a smaller arrow. The radiation beam PB illuminates a substrate illumination region (sometimes referred as a substrate exposure slit). A right hand end of the die C1 is illuminated by the exposure slit. The substrate is moved through the illuminated substrate exposure slit from left to right in a scanning motion (as indicated by an arrow).

Referring to FIGS. 2B and 2C, the mask MA is moved in a scanning motion from in the −y-direction, while the substrate W is moved in a scanning motion in the y-direction. The movement takes into account the reduction factor of the projection system PL, the movement of the substrate W being one quarter of the movement of the mask MA. As a result of the movement, the mask MA moves through the mask exposure slit such that an entire patterned portion of the mask is illuminated by the mask exposure slit. Similarly, the substrate W moves such that the entire die C1 is illuminated by the substrate exposure slit.

Once exposure of the die C1 has been completed, the substrate is moved such that a die which is located behind the exposed die C1 is positioned for exposure. The movement of the substrate may be best understood by referring to FIG. 3. FIG. 3 shows five dies C1-C5 viewed from above. The first die C1 is exposed when moving the substrate from left to right as indicated by an arrow and a rectangle SS which represents the substrate exposure slit. The substrate W is then moved such that the second die C2 may be exposed. This involves moving the substrate in the x-direction such that the second die C2 is aligned with the projections system PL and is ready to receive patterned radiation.

The exposure of the second die C2 is shown in FIGS. 2D-F. Referring first to FIG. 2D, the radiation beam PB illuminates a mask exposure slit which is initially located at a right hand end of the mask MA. The projection system PL projects patterned radiation to form a substrate exposure slit which is initially at a left hand end of the second die C2. Referring to FIGS. 2E and 2F the mask MA is moved in the y-direction in a scanning motion, while the substrate W (and second die C2) is moved in the –y-direction. Thus, during exposure of the second die C2 the direction of movement of the mask MA is opposite to the direction of movement of the mask during exposure of the first die C1. Similarly, the direction of movement of the substrate W is opposite to the direction of movement of the substrate W during exposure of the first die C1.

As may be seen from FIG. 3, exposure of the third die again requires movement of the substrate in the x-direction, and requires a change of scanning movement direction of both the mask and the substrate. A change of direction of the mask and substrate is required after each die is exposed. This is time consuming since it requires the deceleration of the mask and substrate to a zero velocity and then requires acceleration of the mask and substrate to a scanning velocity in the opposite direction. Thus, the changes of direction have a negative effect on the throughput of the lithographic apparatus.

Figure 4:
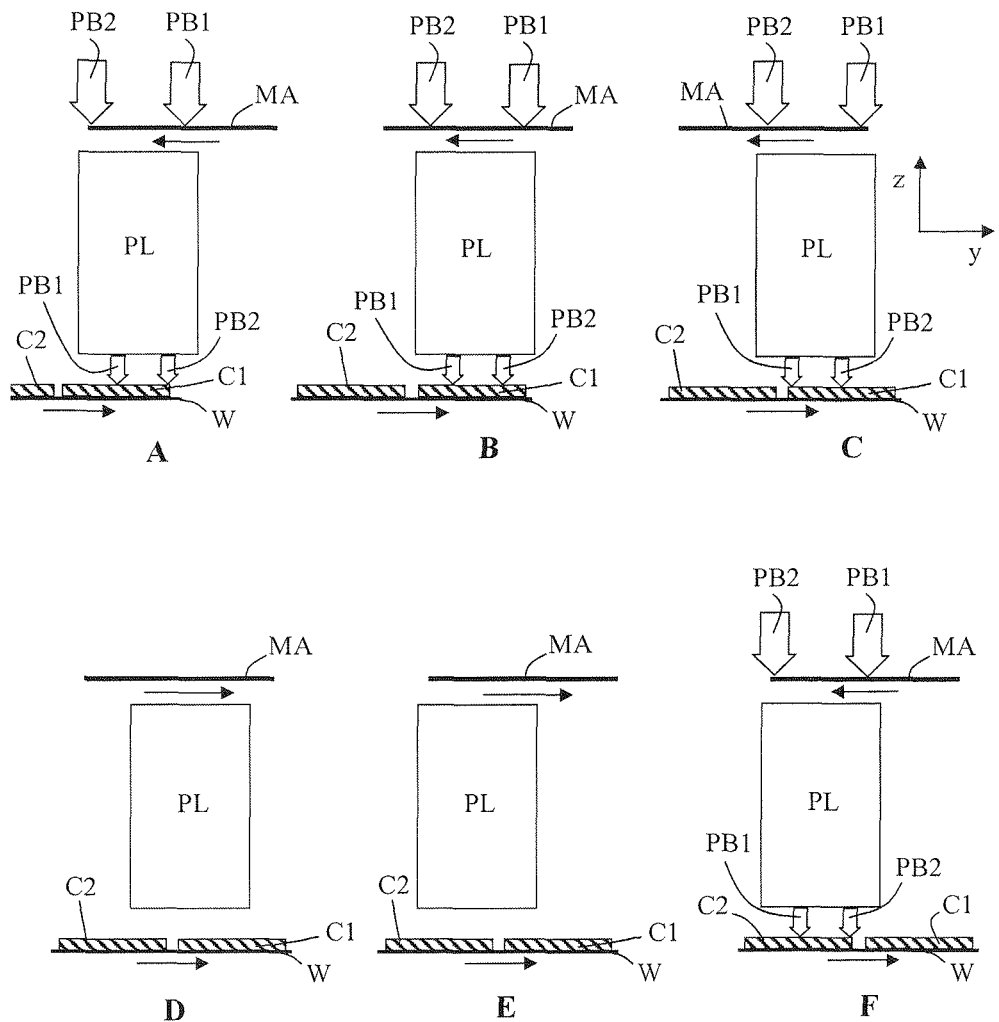

FIGS. 4 and 5 show schematically an example of a lithographic apparatus which overcomes or mitigates the above problem by allowing exposure of successive dies to be performed, while scanning the substrate in the same direction.

Referring first to FIG. 4A, instead of providing a single radiation beam PB, two radiation beams PB1, PB2 are provided. The first radiation beam PB1 illuminates a first mask illumination region and the second radiation beam PB2 illuminates a second mask illumination region. These may be referred to as first and second mask exposure slits. When the mask MA is in the position shown FIG. 4A the first radiation beam PB1 illuminates a left hand end of the mask MA. The second radiation beam PB2 illuminates the centre of the mask MA. The projection system PL projects the two patterned radiation beams PB1, PB2 onto a first die C1. The projection system has a reduction factor of 4, and this indicated schematically by representing the patterned radiation beams PB1, PB2 with smaller arrows. The radiation beams PB1, PB2 illuminates two substrate illumination regions (these may be referred to as two substrate exposure slits). When the substrate is the position shown in FIG. 4A, the first radiation beam PB1 illuminates an exposure slit which extends across the middle of the die C1, and the second radiation beam PB2 illuminates an exposure slit which is located at a right hand end of the die C1. Thus, two mask exposures slits and two substrate exposure slits are illuminated simultaneously, or at least substantially simultaneously.

Referring to FIGS. 4B and 4C, the mask is moved in the –y-direction, while at the same time moving the substrate W in the y-direction. The movement of the mask MA and the substrate W is sufficient to illuminate the entire mask and entire die C1, but is significantly less than the movement of the mask and substrate required by the prior art. This is because a left hand half of the mask MA is illuminated by the first radiation beam PB1 and a right hand half of the mask is illuminated by the second radiation beam PB2. Thus, illumination of the entire mask MA is achieved by moving the mask half of the distance that was required by the prior art.

A corresponding reduction of the movement of the substrate W may also be seen in FIG. 4. Half of the die C1 is exposed by a first substrate exposure slit illuminated by the first radiation beam PB1, and half of the die is illuminated by a second substrate exposure slit illuminated by the second radiation beam PB2.

Referring to FIG. 4C, the entire first die C1 has been exposed by moving the mask MA and substrate W through a considerably shorter distance than is required by the prior art. As a result of this reduced movement, a significant additional movement of the substrate W in the y-direction is required before illumination of the second die C2 may be performed. This additional movement is shown in FIGS. 4D and 4E. The substrate W continues travel in the y-direction. This movement may for example be at the same speed as the scanning movement of the substrate during exposure of the first die C1. During this movement of the substrate W the radiation beams are blocked (for example using reticle masking blades) such that the mask and substrate are not illuminated.

The mask is moved in the y-direction until it has returned to its original position, as shown in FIG. 4F. As a result of the movement of the substrate W and the mask MA, the exposure of the second die C2 is begun from an initial position of the mask MA and second die C2 which corresponds to the initial position of the mask and first die C1 shown in FIG. 4A. Exposure of the second die C2 is therefore performed in the same manner as exposure of the first die C1. No change of direction of the substrate W is required.

In the embodiment shown in FIG. 4 the first die C1 is exposed using two substrate exposure slits. There will be a zone in the middle of the first die C1 where the portion of the die that was exposed by the first substrate exposure slit will meet the portion of the die that was exposed by the second substrate exposure slit. Stitching may be used to link the two portions together (e.g., using known methods of stitching).

In a modified embodiment, the mask MA of FIG. 4 may be provided with patterns for two dies rather than one die. The first radiation beam PB1 may be used to project the first die onto the substrate and the second radiation beam PB2 may be used to project the second die onto the substrate. Where this is done there is no zone where the projected patterns meet, since there will be a gap between the first die and the second die. For this reason stitching may not be needed.

FIG. 5 illustrates schematically exposure of twelve dies C1-12 using the embodiment of the present invention. The first and second substrate exposure slits are indicated by rectangles SS1, SS2 on the first die C1. Exposure of a first row of dies C1-6 is performed with the substrate always moving in the y-direction as represented by arrows. When this row of dies has been exposed, the substrate is moved in the x-direction to allow a second row of dies C7-12 to be exposed. The second row of dies C7-12 is exposed, while continually moving the substrate in the –y-direction.

Since the direction of scanning movement of the substrate does not need to be reversed after exposure of each die, exposure of the dies may be performed more quickly than exposure of dies using the prior art method shown in FIGS. 2 and 3, and the throughput of the lithographic apparatus is thereby increased. Other embodiments of the present invention (described further below) may provide the same advantage.

In addition to avoiding the need to reverse the direction of movement of the substrate, the embodiment of the present invention also avoids the need to move the substrate in the x-direction after exposure of each die. This provides an additional saving of time and thus also improves the throughput of the lithographic apparatus. Other embodiments of the present invention (described further below) may provide the same advantage.

Figure 6:
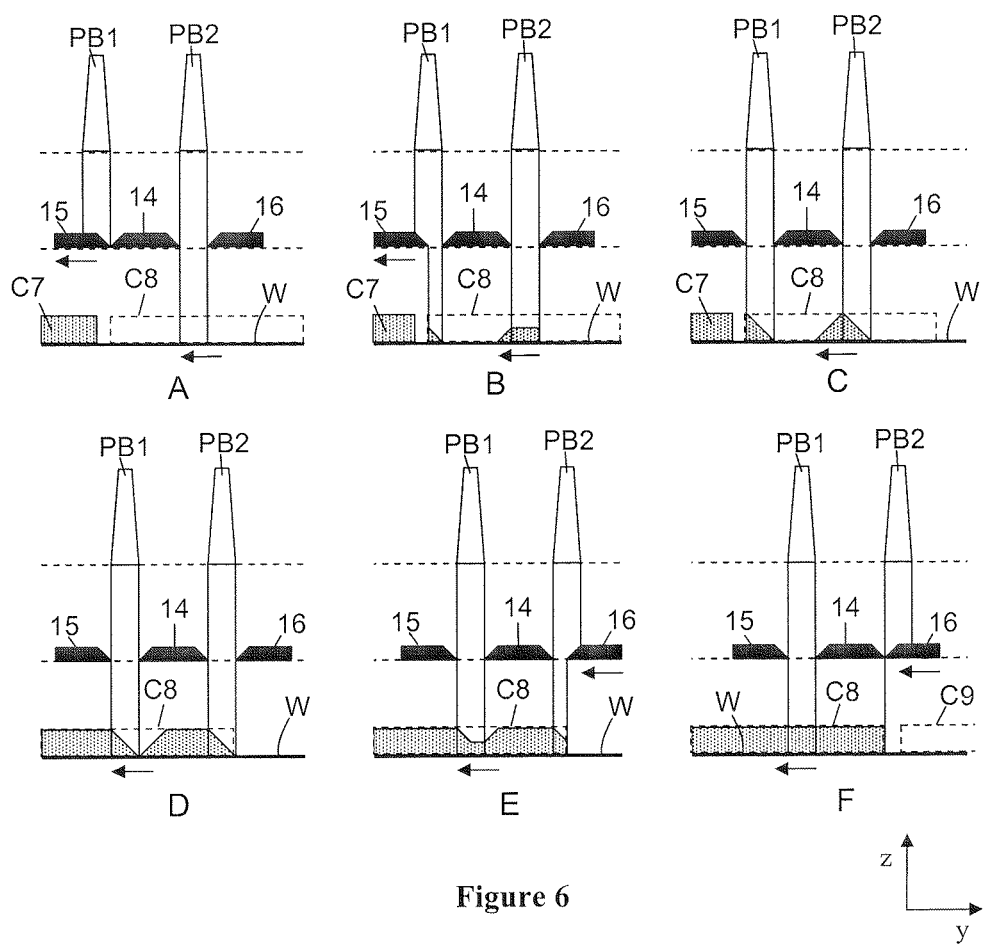

Although they are not shown in FIG. 1 and FIG. 4, reticle masking blades may be used to control the positions of edges of the radiation beams PB1, PB2 when they are incident upon a substrate. FIG. 6 shows schematically the operation of reticle masking blades during exposure of a die C8 (i.e., the second die of the second row shown in FIG. 5). The projection system and components of the illumination system are omitted from FIG. 6 for ease of illustration. The lithographic apparatus is provided with three reticle masking blades 14-16. A central reticle masking blade 14 is fixed. The left hand reticle masking blade 15 and the right hand reticle masking blade 16 are both moveable in the y-direction, and may thus be used to block radiation and allow the transmission of radiation as desired.

Referring first to FIG. 6A, exposure of a preceding die C7 has been completed and the next die C8 is positioned for exposure. The die C8 is indicated by a dotted line which schematically shows an area of resist that is to be exposed. A front edge of the die C8 is not yet beneath the first radiation beam PB1 and the left hand and middle reticle masking blades 15, 14 block the first radiation beam so that it is not incident upon the substrate W. The right hand and middle reticle blades 16, 14 are open so that the second radiation beam PB2 is incident upon the substrate W.

FIG. 6B shows the lithographic apparatus and die C8 a short time later. The left hand blade 15 has partially opened to allow part of the first radiation beam PB1 to expose a front edge of the die C8. Movement of the left hand reticle blade 15 is synchronized with movement of the substrate W (taking into account the reduction factor of the projection system (not shown)). Thus, the left hand reticle blade 15 ensures that radiation exposes the front edge of the die C8 but does not expose outside of the die. Exposure of resist is indicated by shading in FIG. 6. It may be seen that in addition to a front edge of the die C8 being exposed by the first radiation beam PB1 a middle portion of the die is exposed by the second radiation beam PB2.

FIG. 6C shows the lithographic apparatus and die C8 a short time later. The front edge of the die C8 has now progressed such that the left hand reticle blade 15 can be fully opened without radiation falling outside of the die C8. Both the left hand and the right hand reticle blades 15, 16 are thus fully opened. A front portion and a central portion of the die C8 are being exposed respectively by the first and second radiation beams PB1, PB2.

FIG. 6D shows the lithographic apparatus and die C8 a significant time later. The front edge of the die C8 has moved well beyond the edge of the left hand reticle blade 15 and most of the die has been exposed. A rear edge of the die C8 is aligned with the right hand reticle blade 16. The right hand reticle blade 16 will begin moving towards the middle reticle blade 14 with a movement which is synchronized with the movement of the rear edge of the die.

FIG. 6E shows the lithographic apparatus and die C8 a short time later. The right hand reticle blade 16 partially blocks the second radiation beam PB2 and ensures that radiation is not incident outside of the die C8. The left hand reticle blade 15 remains in a fully open position thereby allowing continued exposure of a central portion of the die C8 by the first radiation beam PB1.

FIG. 6F shows the lithographic apparatus and die C8 a short time later when exposure of the die C8 has just been completed. The right hand reticle blade 16 has been used to block the second radiation beam PB2 thereby preventing radiation being incident outside of the die C8. The left hand reticle blade 15 remains open and has allowed exposure of a central portion of the die C8 to be completed. The die C8 has now been fully exposed, as schematically indicated by the grey shading. One the die C8 has been fully exposed the source SO (see FIG. 1) is switched off (or the radiation which it emits is blocked) to prevent further exposure of the die C8.

Once the source SO has been switched off, movement of the substrate W continues until a subsequent die C9 is positioned such that the next exposure may begin (i.e., it is positioned as shown in FIG. 6A). At the same time as the substrate is moving to the next exposure location the mask (not shown in FIG. 6) from which the die pattern is projected is returned to an initial position (e.g., as shown in FIG. 4). The left hand reticle blade 15 is closed and the right hand reticle blade 16 is opened. The reticle blades 15, 16 are thus returned to the position shown in FIG. 6A.

Movement of the reticle blades may be controlled by a control apparatus (not illustrated). The control apparatus may also control the movement of the mask and substrate, and may also control the generation of radiation by the source.

Although two radiation beams PB1, PB2 are shown in FIGS. 4, 5 and 6, more than two radiation beams may be used. For example, three radiation beams may be used. Where this is done the scanning movement of the mask and substrate required to expose the substrate may be a third of the scanning movement of the mask and substrate required by the prior art. Four or more radiation beams may be used.

In a modified embodiment, a die may be exposed as shown in FIGS. 4A-C and the substrate W may then be moved in the x-direction in a prior art manner (e.g., as shown in FIG. 3) before exposing the substrate by moving the mask MA and substrate in an opposite direction. In other words, the apparatus shown in FIG. 4 may be used to expose a substrate using a method which is similar to the prior art method shown in FIG. 2. Doing this provides an increase of throughput over the prior art because the speed of the mask MA and the substrate W during exposure of a die is less than in the prior art method. As a result, it is possible to change the direction of the substrate and the direction of the mask more rapidly, thereby reducing the time delay between exposure of successive dies.

FIG. 7 shows schematically one way in which the two radiation beams PB1, PB2 may be created. A single radiation beam (not shown) is incident upon a diffractive optical element 10 which comprises a diffractive grating or other diffracting structure that is configured to split the radiation beam into two radiation beams PB1, PB2. The diffractive optical element 10 may for example be of the type that is used to form a dipole illumination mode in a conventional lithographic apparatus.

The diffractive optical element 10 is located in a pupil plane of the lithographic apparatus (or adjacent to a pupil plane) and applies angular characteristic to the radiation beam such that two radiation beams are formed. A lens or group of lens 12 (referred to hereafter as the field lens group) directs the radiation beams PB1, PB2 via openings provided by reticle masking blades 14-16 onto a mask MA. The mask MA is located in a field plane of the lithographic apparatus. The first and second radiation beams PB1, PB2 illuminate two mask exposure slits MS1, MS2 shown in plan view in FIG. 7). The shape of the mask exposure slits MS1, MS2 is generally determined by the diffractive optical element 10. However, the reticle masking blades 14-16 may modify the shape of the exposure slits MS1, MS2 by cutting off edges of the mask exposure slits. This ensures that the mask exposure slits are provided with sharp edges. The mask exposure slits MS1, MS2 may be generally rectangular (as shown in FIG. 7) but may include tapering of radiation intensity at the front and back of the exposure slits (the sides which extend in the x-direction).

In addition to forming the first and second radiation beam PB, PB2 the diffractive optical element 10 may also provide a zero-order beam of radiation (not shown). This beam of radiation travels along the optical axis 0A but is blocked by the middle reticle masking blade 14 before it reaches the mask MA.

FIG. 8 shows the embodiment of FIG. 7 but includes some features which either not present or are not illustrated in FIG. 7. Elements which are common to both FIGS. 7 and 8 are provided with the same reference numerals. A diffractive optical element 10 separates an incident radiation beam (not shown) into two diverging radiation beams PB1, PB2. A field lens group 12 is configured to configured to stop further divergence of the radiation beams PB1, PB2 and to orient the radiation beams parallel to the optical axis 0A (i.e., to collimate the radiation beams PB1, PB2). A first pair of wedges 18 are configured to increase the separation between the radiation beams PB1, PB2. A second pair of wedges 20 is configured to collimate the radiation beams PB1, PB2. The second pair of wedges 20 is moveable along the optical axis. Moving the second pair of wedges 20 further away from the first pair of wedges 18 increases the separation between radiation beams PB1, PB2. Moving the second pair of wedges 20 closer to the first pair of wedges 18 reduces the separation between the radiation beams PB1, PB1. In an alternative arrangement the first pair of wedges 18 may be moveable along the optical axis 0A and may provide the same effect as effect as the second pair of wedges. The embodiment shown in FIG. 8 allows the separation between the exposure slits to be adjusted. This is advantageous because it allows embodiments of the present invention to be used for different die sizes (in the scanning direction) without reducing the throughput of the lithographic apparatus. The separation between the exposure slits may be adjusted using optical apparatus which is different to that shown in FIG. 8.

Also shown in FIG. 8 are lenses 22, 23 which are used to direct the radiation beams PB1, PB2 onto the mask MA. These lenses may be referred to as relay lenses. Although reticle masking blades 14-16 are not shown in FIG. 8, the reticle masking blades may for example be provided adjacent to the mask MA (e.g., as shown in FIG. 7) or may be provided after the second pair of wedges 20. The reticle masking blades may be provided in a field plane or adjacent to a field plane of the lithographic apparatus.

A further alternative embodiment is illustrated schematically in FIG. 9. Referring to FIG. 9, a diffractive optical element 10 which is configured to generate two radiation beams PB1, PB2 is not located before the field lens group 12. Instead, a field defining element 24 (which may for example be a diffractive optical element) is provided which generates a desired exposure slit shape (e.g., a rectangle). Thus, a single radiation beam PB passes through the field lens group 12 via a field plane FP to a lens 22. Reticle masking blades 26, 27 may be provided in the field plane (or adjacent to the field plane). The reticle masking blades may be used to apply sharp edges to radiation beam PB, and may be used to block the radiation beam when the mask and substrate are moved between successive exposure positions (see FIGS. 4D and 4E). The lens 22 focuses the radiation beam PB to a pupil plane in which a diffractive optical element 10 is located (the diffractive optical element may alternatively be located adjacent to the pupil plane). In common with the diffractive optical element 10 shown in FIGS. 6 and 7, the diffractive optical element is configured to convert the radiation beam PB into two diverging radiation beams PB1, PB2. A lens 23 collimates the first and second radiation beams PB1, PB2 and directs them onto a mask MA. Zero-order radiation transmitted by the diffractive optical element 10 may be blocked using a beam stop or other suitable apparatus (not shown).

An advantage of the embodiment shown in FIG. 9 is that it does not require a new design of reticle masking blades (e.g., as shown in FIG. 7), but instead may use a conventional pair of reticle masking blades 26, 27 which may be provided in the field plane FP after the field lens group 12 (or adjacent to the field plane).

The diffractive optical element 10 used in the embodiments shown in FIGS. 7-9 may for example be similar to a diffractive optical element that is conventionally used to form a dipole illumination mode in a conventional lithographic apparatus.

An alternative embodiment is shown schematically in FIG. 10. In the alternative embodiment the first and second radiation beams are not generated using a diffractive optical element but instead are generated using a semi-transparent mirror.

In FIG. 10 a radiation beam PB is incident upon a semi-transparent mirror 30. Half of the radiation beam is reflected by the semi-transparent mirror 30 to form a first radiation beam PB1. The first radiation beam PB1 passes through an optical path corrector 32 before passing through a dose controlling apparatus 34. The other half of the radiation beam PB passes through the semi-transparent mirror 30 to form a second radiation beam PB2. The second radiation beam PB2 is reflected by a mirror 36 which directs the second radiation beam through a dose controlling apparatus 34. The apparatus shown in FIG. 10 may be provided before reticle masking blades (not shown) of the lithographic apparatus. For example, the apparatus may be provided instead of the diffractive optical element 10 of FIGS. 7 and 9. Alternatively, the apparatus shown in FIG. 10 may be located after reticle masking blades (not shown), for example instead of the diffractive optical element 10 of FIG. 9.

It is desirable that the first and second radiation beams PB1, PB2 travel along the same optical path lengths before being incident upon a mask (not shown). Because the second radiation beam PB2 passes beyond the semi-transparent mirror 30 before being directed towards the dose controlling apparatus 34 by the mirror 36, the second radiation beam will have a longer optical path length than the first radiation beam PB1 (in the absence of an optical path corrector). The optical path corrector 32 increases the optical path length travelled by the first radiation beam PB1 such that the optical path lengths travelled by the first and second radiation beams PB1, PB2 are equal (or are substantially equal). The optical path corrector 32 may for example be a material which has a refractive index greater than 1 but which is transparent to the radiation beam PB1. For example, the optical path corrector 32 may be optical glasses, e.g., fused silica or calcium fluorite.

The dose controlling apparatus 34 may be used to attenuate one of the radiation beams PB1, PB2 in order to equalize the intensities of the radiation beams and/or to equalize the exposure doses that they provide. Examples of dose controlling apparatus are described further below.

In a modified embodiment (not illustrated), the optical path corrector 32 is omitted from the apparatus. Instead, the thickness of the semi-transparent mirror 30 is selected to compensate for differences in optical path length travelled by the first and second radiation beams PB1, PB2. In this modified embodiment the semi-transparent mirror 30 has a transparent front surface and a semi-transparent back surface. Radiation which is reflected by the semi-transparent mirror 30 thus passes through the body of the semi-transparent mirror twice, whereas radiation which is transmitted by the semi-transparent mirror only passes through the body of the semi-transparent mirror once. Making the body of the semi-transparent mirror 30 thicker will thus increase the path length of the first radiation beam PB1 relative to the path length of the second radiation beam PB2.

In a modified embodiment (not illustrated), two semi-transparent mirrors are provided together with a conventional mirror. The three mirrors are used to convert an incident radiation beam into three radiation beams in a manner analogous to that shown in FIG. 10. The reflectivity of the first mirror may be 33%, the reflectivity of the second mirror may be 50%, and the reflectivity of the third mirror may be 100%. Optical path correctors and a dose controlling apparatus may be used.

In a modified embodiment the semi-transparent mirror may provide dose control. FIG. 11 shows schematically a semi-transparent mirror 40 which may provide dose control. The semi-transparent mirror 40 comprises a plurality of fixed mirrors 42 which are spaced apart from one another, and a plurality of movable mirrors 44 which are also spaced apart from one another. The movable mirrors 44 may be moved from a position in which they are located behind the fixed mirrors 42 (as shown in FIG. 11A) to a position in which they partially project from behind the fixed mirrors (as shown in FIG. 11B). When the movable mirrors 44 are located behind the fixed mirrors 42 less than half of the radiation beam PB is reflected by the fixed mirrors 42 to form a first radiation beam PB1 and more than half of the radiation beam is transmitted through gaps to form a second radiation beam PB2. When the movable mirrors 44 project from behind the fixed mirrors 42 they reflect an additional portion of the radiation beam PB, thereby increasing the portion of radiation present in the first radiation beam PB1. In addition, the movable mirrors 44 reduce the size of gaps between the fixed mirrors 42, thereby reducing the intensity of radiation which passes the adjustable mirror 40 to form the second radiation beam PB2. Thus, the movable mirrors 44 allow the relative intensities of the first and second radiation beams PB1, PB2 to be adjusted. The adjustable mirror 40 has an adjustable transmissivity. This may avoid the need to provide an additional dose controlling apparatus in the lithographic apparatus.

Configuring the fixed mirrors 42 such that less than half of the radiation beam PB is reflected by the fixed mirrors 42 to form a first radiation beam PB1 and more than half of the radiation beam is transmitted through gaps to form a second radiation beam PB2 is advantageous, because it allows the intensity of radiation in the first and second radiation beams PB1, PB2 to be adjusted to be more than 50% or less than 50% of the incident radiation beam PB.

The semi-transparent mirror 40 is not located in or near to a field plane of the lithographic apparatus, and consequently the intermittent pattern formed by the gaps between mirrors is not seen at the mask MA or at the substrate W. In addition, the intermittent pattern is formed in a direction which corresponds to the scanning direction of the lithographic apparatus (indicated by arrows in FIG. 11), thereby allowing the effect of the intermittent pattern to be averaged out during scanning exposures performed by the lithographic apparatus.

FIG. 12 shows schematically an alternative embodiment which may be used to generate first and second radiation beams. The alternative embodiment uses a first pair of wedges 50 to separate a radiation beam PB into two parts (the separation occurring in the scan direction which is indicated in FIG. 12 as the y-direction). The radiation beam PB may for example have a Gaussian profile or some other profile. When the radiation beam is separated into two parts, each part may comprise half of that profile. Thus, the first radiation beam part PB1a may have a profile which comprises the left hand side of a Gaussian (or other form), and the second radiation beam part PB2a may comprise the right hand half of a Gaussian (or other form).

A second pair of wedges 52 is configured to collimate the first and second radiation beam parts PB1a, PB2a. The separation between the first and second radiation beam parts PB1a, PB2a may be adjusted by adjusting the separation between the first and second pairs of wedges 50, 52. The first radiation beam part PB1a is incident upon a beam reversal and recombination apparatus 54. The beam reversal and recombination apparatus 54 is configured to faint a mirror image of the radiation beam part PB1a and then combine that with the radiation beam to form a first radiation beam PB1 which has a Gaussian form (or other form) as represented schematically in FIG. 12. A second beam reversal and recombination apparatus 55 modifies the second radiation beam part PB2a to form a second radiation beam PB2 in the same manner.

FIG. 13 schematically shows the first beam reversal and recombination apparatus 54. It comprises two concave mirrors 56, 57 which share the same focal point, and two semi-transparent beamsplitters 58, 59. A first semi-transparent beamsplitter 58 is located at an entrance of the beam reversal and recombination apparatus 54, and a second semi-transparent beamsplitter 59 is located at an exit of the beam reversal and recombination apparatus.

As shown in FIG. 13A, on entering the beam reversal and recombination apparatus 54, half of the first radiation beam part PB1a is reflected by the first beamsplitter 58. This half of the first radiation beam part is reflected from the lower concave mirror 57, is then reflected from the upper concave mirror 56, and half of the radiation beam part then passes out of the beam reversal and recombination apparatus through reflection by the second beamsplitter 59. In FIG. 13A one side of the first radiation beam part PB1a is indicated using solid line and one side is indicated using a dotted line, to allow image reversal of the radiation beam part to be seen. The half of the first radiation beam part which was reflected via the first beamsplitter 58, lower concave mirror 57, upper concave mirror 56 and second beamsplitter 59 has undergone image reversal (i.e., its profile has been flipped).

As is also shown in FIG. 13A, half of the radiation part which is incident upon the first beamsplitter 58 passes through the first beamsplitter and is incident upon the second beamsplitter 59. Half of this radiation passes through the second beamsplitter 59 and passes out of the beam reversal and recombination apparatus 54. This half of the radiation has not undergone image reversal (i.e., its profile has not been flipped). Thus, radiation which has undergone image reversal and radiation which has not undergone image reversal is delivered from the beam reversal and recombination apparatus 54, thereby providing the first radiation beam PB1 with a desired profile (as shown schematically in FIG. 12).

FIG. 13A also indicates the path of radiation which is initially reflected by the first beamsplitter 58 and is then transmitted by the second beamsplitter 59. Half of this radiation may pass through the first beamsplitter 58 and add to the radiation that was initially reflected by the first beamsplitter. The other half of the radiation may be reflected by the first beamsplitter 58 and add to the radiation that was initially transmitted by the first beamsplitter.

FIG. 13B also shows the beam reversal and recombination apparatus 54, but shows the route of radiation which passes through the first beamsplitter 58 and is then reflected by the second beamsplitter 59 (FIG. 13A shows the route of radiation which is initially reflected by the first beamsplitter 58). As may be seen from FIG. 13B, a portion of the radiation undergoes image reversal and a portion of the radiation does not, thereby providing the first radiation beam PB1 with a desired profile.

In the above description the beamsplitters 58, 59 reflect half of incident radiation and transmit half of incident radiation. However, the beamsplitters may for example reflect more than half of incident radiation or reflect less than half of incident radiation (the beam reversal and recombination apparatus 54 will still work correctly).

In common with other embodiments, the embodiment shown in FIGS. 12 and 13 may be provided at various locations within the lithographic apparatus. The embodiment may be provided before or after reticle masking blades.

The dose controlling apparatus 34 shown in FIG. 10 may have a variety of different forms. The dose controlling apparatus may for example comprise a set of fingers which may be extended into or out of intersection with one of the radiation beams PB1, PB2. The fingers may for example be provided in a field plane (or adjacent to a field plane), and may extend in a direction which corresponds with the scanning movement direction of the mask MA and substrate W. Bringing a finger into intersection with a portion of one of the radiation beams will reduce the dose of radiation delivered to a die by that portion of the radiation beam. This is because the width of the exposure slit has been reduced, thereby reducing the amount of time that the die is illuminated by that portion of the exposure slit.

In an alternative embodiment the dose controlling apparatus may comprise one or more partially transmissive filters which may be brought into intersection with or removed from intersection with one of the radiation beams. For example, plates having different degrees of transmissivity may be provided. A given plate may be brought into intersection with a radiation beam in order to reduce the intensity of that radiation beam by a desired amount. In a similar embodiment, a single plate having different amounts of transmissivity at different locations may be used. The plate may be moved between for example a first position in which a radiation beam passes through a portion of the plate which has high transmissivity, and a second position in which the radiation beam passes through a portion of the plate which has lower transmissivity.

The dose controlling apparatus may for example be provided in a field plane of the lithographic apparatus, or may for example be provided adjacent to a field plane of the lithographic apparatus.

The dose controlling apparatus may be provided in an illumination system of the lithographic apparatus or may be provided in a projection system of the lithographic apparatus.

In an alternative embodiment, a variable attenuator may be used to adjust the intensity of a radiation beam. The variable attenuator may for example comprise a transmissive plate which separates a portion of the radiation beam and directs it away from the optical axis. The amount of the radiation beam which is separated by the plate may be adjusted by adjusting the orientation of the plate relative to the optical axis.

In an embodiment, more than one dose controlling apparatus may be provided for each radiation beam. For example, fingers which may be extended into or out of intersection with the radiation beam may be provided in combination with a variable attenuator or partially transmissive plate.

The dose controlling apparatus may be used to remove or reduce differences of intensity between the first and second radiation beam PB1, PB2. The dose controlling apparatus may be used to improve the uniformity of radiation delivered in an exposure slit (uniformity being considered in a direction which runs transverse to the scanning direction of the lithographic apparatus).

A further alternative embodiment of the present invention is shown schematically in FIG. 14. In this embodiment of the present invention the mask MA is illuminated by a single radiation beam PB. The radiation beam is then separated into two radiation beams PB1, PB2 by a beam splitter 60 which is provided in a field plane in the projection system PS (or adjacent to a field plane). A first radiation beam PB1 passes through the beam splitter 60, is reflected by two mirrors 61, 62 and passes through projection optics (not shown) before being incident upon the substrate W. The second radiation beam PB2 is reflected by the beam splitter 60 and is then reflected by a mirror 63 before travelling through projection optics (not shown) and being incident upon the substrate W.

The projection system PS forms two images of the mask MA on the substrate W. Therefore, if the mask MA contains a pattern for a single die, two dies are simultaneously, or at least substantially simultaneously, projected onto the substrate W.

The apparatus may be used to provide scanning projection of the mask pattern onto the substrate W. The mask MA may for example move in the −y-direction such that it passes through a mask exposure slit formed by the radiation beam PB. Similarly, the substrate W may move in the y-direction such that adjacent dies on the substrate pass through first and second substrate exposure slits formed respectively by the first and second radiation beams PB1, PB2. In this way two dies are exposed on the substrate W during a single scan of the mask MA.

Once exposure of first and second dies on the substrate W has taken place, a period of time will elapse before the continued motion of the substrate W in the scanning direction brings unexposed dies beneath the projection system PS. During this period of time the mask MA may be returned to an initial position. Thus, the apparatus as shown in FIG. 14 may be used to perform a method which corresponds with that shown in FIGS. 4 and 5 (the primary difference between the methods being that two dies are patterned during each scanning exposure rather than one die).

In a further alternative embodiment (not illustrated) a diffractive optical element may be used instead of the beam splitter 60. The diffractive optical element may be provided in or adjacent to a pupil plane of the projection system, and may split the radiation beam PB into a pair of radiation beams PB1, PB2 (for example in the manner shown in FIG. 8).

A further alternative embodiment of the present invention is shown schematically in FIG. 15. This embodiment corresponds with the embodiment shown in FIG. 4, except that the first and second radiation beams PB1, PB2 are relatively close together when they are incident upon the mask MA, and are then provided with an increased separation by the projection system PS. The projection system PS is provided with a pair of mirrors 71, 72 in a field plane (or adjacent to a field plane).

The first mirror 71 directs the first radiation beam PB1 towards a third mirror 73 which then directs the first radiation beam towards the substrate W. The second mirror 72 directs the second radiation beam PB2 towards a fourth mirror 74 which then directs the second radiation beam towards the substrate W. The first and second radiation beams PB1, PB2 may pass through projection optics (not shown) before being incident upon the substrate.

The first and second mirrors 71, 72 may be provided as two sides of a triangular prison.

The apparatus shown in FIG. 15 may be used in the same manner as the apparatus shown in FIG. 14. The mask MA may for example move in the −y-direction such that it passes through two overlapping mask exposure slits formed by the radiation beams PB1, PB2. Similarly, the substrate W may move in the y-direction such that adjacent dies on the substrate pass through first and second substrate exposure slits formed respectively by the first and second radiation beams PB1, PB2. In this way two dies are exposed on the substrate W during a single scan of the mask MA.

Once exposure of first and second dies on the substrate W has taken place, a period of time will elapse before the continued motion of the substrate W in the scanning direction brings unexposed dies beneath the projection system PS. During this period of time the mask MA may be returned to an initial position. The apparatus as shown in FIG. 15 may thus be used to perform a method which corresponds with that shown in FIGS. 4 and 5 (the primary difference between the methods being that two dies are patterned during each scanning exposure rather than one die).

Although embodiments of the present invention have mostly used two radiation beams PB1, PB2, embodiments may use three radiation beams, four radiation beams, or more.

Although embodiments of the present invention have mostly patterned a single die at a time, embodiments of the present invention may pattern more than one die simultaneously, or at least substantially simultaneously, (e.g., with each radiation beam patterning a different die).

Cartesian coordinates are used in the above description to facilitate explanation of embodiments of the present invention. The Cartesian coordinates are indicative only, and are not intended to imply that any components of the lithographic apparatus must have a specific orientation.

In described embodiments of the present invention the scanning movement of the substrate W has been in an opposite direction to the scanning movement of the mask MA. However, this is not essential, and the scanning movement of the substrate W may be in the same direction as the mask MA.

In described embodiments of the present invention the first and second radiation beams PB1, PB2 are generated using a single illumination system. However, they could be generated using separate illumination systems.

In an embodiment, the lithographic apparatus may further comprise a control system which is configured to control operation of the lithographic apparatus such that it performs one or more of the methods described above.

In order to facilitate the projection of two or more exposure slits, the projection system PL may be larger than a conventional projection system. The object field of the projection system may be larger than the object field of a conventional projection system.

Operation of any of the described embodiments of the present invention may be controlled by a control apparatus (not shown). The control apparatus may control the lithographic apparatus such that it implements methods described above.

While specific embodiments of the present invention have been described above, it will be appreciated that the present invention may be practiced otherwise than as described. The description is not intended to limit the present invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different than those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. A lithographic apparatus, comprising:
an illumination system configured to provide a first beam of radiation, which forms a first mask illumination region, and configured to substantially simultaneously provide a second beam of radiation, which forms a second mask illumination region, the first and second illumination regions being configured to simultaneously illuminate the same mask;
a first set of reticle masking blades including one fixed and two moveable reticle masking blades provided at a location that receives the first and second beams of radiation in use, wherein the first set of reticle masking blades are configured to provide an opening for the first beam of radiation and an opening for the second beam of radiation; and
a projection system configured to project the first radiation beam, such that it forms a first substrate illumination region, and configured to substantially simultaneously project the second radiation beam, such that it forms a second substrate illumination region.

2. The lithographic apparatus of claim 1, wherein:
the illumination system is configured to provide at least one additional beam of radiation, which forms at least one additional mask illumination region, which illuminates the mask substantially simultaneously with the first and second mask illumination regions; and
the projection system is configured to project the at least one additional radiation beam, such that it forms an additional substrate illumination region substantially simultaneously with the first and second substrate illumination regions.

3. The lithographic apparatus of claim 1, wherein the first and second mask illumination regions overlap with each other.

4. The lithographic apparatus of claim 1, wherein the illumination system comprises a diffractive optical element, which is configured to separate a radiation beam into the first and second radiation beams.

5. The lithographic apparatus of claim 4, wherein the illumination system is configured to prevent zero-order radiation generated by the diffractive optical element from being incident upon the mask.

6. The lithographic apparatus of claim 1, wherein the illumination system comprises a partially transmissive mirror, which is configured to separate a radiation beam into the first and second radiation beams.

7. The lithographic apparatus of claim 6, wherein the partially transmissive mirror has adjustable transmissivity.

8. The lithographic apparatus of claim 7, wherein the partially transmissive mirror comprises:
a plurality of fixed mirror elements that are separated by gaps; and
a plurality of moveable mirror elements which are moveable into and out of the gaps.

9. The lithographic apparatus of claim 1, wherein the illumination system comprises:
an optical element that is configured to separate a radiation beam into two parts;
a first beam reversal and recombination apparatus configured to form a mirror image of one half of the first radiation beam part and combine it with the other half of the first radiation beam part, and thereby form the first radiation beam; and
a second beam reversal and recombination apparatus configured to form a mirror image of one half of the second radiation beam part and combine it with the other half of the second radiation beam part, and thereby form the second radiation beam.

10. The lithographic apparatus of claim 9, wherein the optical element is a pair of wedges, each of which is configured to intersect with half of the radiation beam.

11. The lithographic apparatus of claim 1, further comprising:
a second set of reticle masking blades provided at a location that receives a radiation beam,
wherein the second set of reticle masking blades are configured to provide an opening for the radiation beam before it is separated into the first radiation beam and the second radiation beam.

12. The lithographic apparatus of claim 1, wherein the illumination system further comprises:
an optical path corrector that is configured to correct the optical path travelled by one of the radiation beams, such that the first and second radiation beams have a same path length or substantially the same path length.

13. The lithographic apparatus of claim 1, further comprising a control system configured to control the lithographic apparatus.

14. A lithographic method, comprising:
providing an opening for a first beam of radiation and an opening for a second beam of radiation using one fixed and two moveable reticle masking blades provided at a location that receives the first and second beams of radiation;
illuminating first and second mask illumination regions with the respective first and second beams of radiation;
moving a mask through the two mask illumination regions, such that the mask is illuminated by the first and second mask illumination regions, and thereby patterns the first and second beams of radiation;
projecting the first and second beams, such that they illuminate respective first and second substrate illumination regions; and
moving a substrate through the first and second substrate illumination regions, such that the substrate is illuminated by the first and second substrate illumination regions, and thereby receives the pattern carried by the first and second beams.

15. The method of claim 14, further comprising:
moving the mask in a first direction from an initial position during illumination of the first and second illumination regions, while moving the substrate in a second opposite direction;
stopping illumination of the mask and returning the mask to the initial position, while continuing to move the substrate in the second direction; and
moving the mask in the first direction from the initial position during illumination of the first and second illumination regions, while continuing to move the substrate in the second direction.

16. The method of claim 15, wherein the mask is provided with a pattern that comprises a single die.

17. The method of claim 15, wherein the mask is provided with a pattern that comprises two or more dies.

18. The method of claim 15, further comprising:
providing an additional beam of radiation using the illumination system;
using the additional radiation beam to illuminate an additional mask illumination region;
moving a mask through the additional illumination region, such that the mask is illuminated by the additional illumination region, while substantially simultaneously being illuminated by the first and second mask illumination regions, and thereby patterns the additional radiation beams;
projecting the additional radiation beam, such that it illuminates an additional substrate illumination region; and
moving the substrate through the additional illumination region, such that the substrate is illuminated by the first and second substrate illumination regions and the additional illumination region, and thereby receives a pattern carried by the first and second beams and the additional radiation beam.

19. The method of claim 15, wherein the first and second mask illumination regions overlap with each other.

20. The method of claim 14, further comprising:
moving the mask in a first direction from an initial position during illumination of the first and second illumination regions, while moving the substrate in a second opposite direction;
stopping illumination of the mask and moving the substrate in a transverse direction; and moving the mask in the second direction during illumination of the first and second illumination regions, while moving the substrate in the first direction.

\* \* \* \* \*